United States Patent
Shirai

(10) Patent No.: US 10,415,152 B2
(45) Date of Patent: Sep. 17, 2019

(54) SIC SINGLE CRYSTAL AND METHOD FOR PRODUCING SAME

(71) Applicant: TOYOTA JIDOSHA KABUSHIKI KAISHA, Toyota-shi, Aichi-ken (JP)

(72) Inventor: Takayuki Shirai, Susono (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 221 days.

(21) Appl. No.: 15/195,071

(22) Filed: Jun. 28, 2016

(65) Prior Publication Data

US 2017/0009374 A1    Jan. 12, 2017

(30) Foreign Application Priority Data

Jul. 9, 2015 (JP) .................................. 2015-138120

(51) Int. Cl.

| | |
|---|---|
| *C30B 19/10* | (2006.01) |
| *C30B 19/06* | (2006.01) |
| *C30B 19/04* | (2006.01) |
| *C30B 19/12* | (2006.01) |
| *C30B 29/36* | (2006.01) |
| *C01B 32/956* | (2017.01) |

(52) U.S. Cl.
CPC .......... *C30B 19/106* (2013.01); *C01B 32/956* (2017.08); *C30B 19/04* (2013.01); *C30B 19/062* (2013.01); *C30B 19/12* (2013.01); *C30B 29/36* (2013.01)

(58) Field of Classification Search
None
See application file for complete search history.

(56) References Cited

U.S. PATENT DOCUMENTS

| | | |
|---|---|---|
| 6,734,461 B1 | 5/2004 | Shiomi et al. |
| 2009/0194017 A1 | 8/2009 | Terashima et al. |
| 2010/0289033 A1* | 11/2010 | Ohtani .................... C30B 29/36 257/77 |
| 2014/0007807 A1 | 1/2014 | Daikoku et al. |
| 2015/0214306 A1 | 7/2015 | Kojima et al. |

(Continued)

FOREIGN PATENT DOCUMENTS

| | | |
|---|---|---|
| CN | 103562443 A | 2/2014 |
| CN | 107075723 A | 8/2017 |

(Continued)

OTHER PUBLICATIONS

Google translation of WO2014136903 Mar. 31, 2018.*
Google translation of JP2009184879 Mar. 31, 2018.*

*Primary Examiner* — Guinever S Gregorio
(74) *Attorney, Agent, or Firm* — Oliff PLC

(57) ABSTRACT

A p-type SiC single crystal having lower resistivity than the prior art is provided. This is achieved by a method for producing a SiC single crystal in which a SiC seed crystal substrate is contacted with a Si—C solution having a temperature gradient such that the temperature decreases from the interior toward the surface, to grow a SiC single crystal, the method comprising: using as the Si—C solution a Si—C solution containing Si, Cr and Al, wherein the Al content is 3 at % or greater based on the total of Si, Cr and Al; and contacting a (0001) face of the SiC seed crystal substrate with the Si—C solution to grow a SiC single crystal from the (0001) face.

1 Claim, 4 Drawing Sheets

(56) References Cited

U.S. PATENT DOCUMENTS

| | | | | |
|---|---|---|---|---|
| 2016/0068993 A1 * | 3/2016 | Shirai | ................ | C30B 9/06 |
| | | | | 257/77 |
| 2016/0237590 A1 * | 8/2016 | Daikoku | ............... | C30B 9/10 |
| 2016/0273126 A1 | 9/2016 | Kusunoki et al. | | |
| 2017/0283982 A1 | 10/2017 | Kusunoki et al. | | |

FOREIGN PATENT DOCUMENTS

| | | | | |
|---|---|---|---|---|
| JP | H09-059085 A | | 3/1997 | |
| JP | 2009-184879 A | | 8/2009 | |
| JP | 2009184879 A | * | 8/2009 | |
| WO | 01/018872 A1 | | 4/2003 | |
| WO | 2014/021365 A1 | | 2/2014 | |
| WO | 2014/136903 A1 | | 9/2014 | |
| WO | WO-2014136903 A1 | * | 9/2014 | ............ C30B 15/00 |
| WO | WO-2015045716 A1 | * | 4/2015 | ............ C30B 9/10 |
| WO | 2015/072136 A1 | | 5/2015 | |

* cited by examiner

SIC SINGLE CRYSTAL AND METHOD FOR PRODUCING SAME

TECHNICAL FIELD

The present invention relates to a SiC single crystal that is suitable as a semiconductor element.

BACKGROUND ART

SiC single crystals are thermally and chemically very stable, superior in mechanical strength, and resistant to radiation, and also have superior physical properties, such as high breakdown voltage and high thermal conductivity, compared to Si single crystals. They are therefore able to exhibit high output, high frequency, voltage resistance and environmental resistance that cannot be realized with existing semiconductor materials, such as Si single crystals and GaAs single crystals, and are being considered ever more promising as next-generation semiconductor materials for a wide range of applications including power device materials that allow high power control and energy saving, device materials for high-speed large volume information communication, high-temperature device materials for vehicles, radiation-resistant device materials and the like. In particular, there is a demand for p-type SiC single crystals with low resistivity, in order to obtain ultra-high voltage-resistant elements that are considered promising for applications in electrical power systems and the like.

Typical growth processes for growing SiC single crystals that are known in the prior art include gas phase processes, the Acheson process, and solution processes. In gas phase processes, for example, sublimation processes have drawback in that grown single crystals have been prone to hollow penetrating defects known as "micropipe defects", lattice defects, such as stacking faults, and generation of polymorphic crystals. However, most SiC bulk single crystals are conventionally produced by sublimation processes. In the Acheson process, heating is carried out in an electric furnace using silica stone and coke as starting materials, and therefore it has not been possible to obtain single crystals with high crystallinity due to impurities in the starting materials.

Solution processes are processes in which molten Si is formed or a molten liquid comprising another metal dissolved in molten Si is formed in a graphite crucible and C is dissolved into the molten liquid, and a SiC crystal layer is deposited and grown on a seed crystal substrate set in the low temperature zone. Solution processes can be expected to reduce defects because crystal growth is carried out in a state of near thermal equilibrium, compared to gas phase processes.

For growth of a SiC single crystal by a solution process, there has been proposed a method in which Al is added to a Si—C solution in order to grow a low-resistance p-type SiC single crystal (PTL 1).

CITATION

Patent Literature

[PTL 1] Japanese Unexamined Patent Publication No. 2009-184879

SUMMARY OF THE INVENTION

Problems to be Solved by the Invention

However, when it is attempted to fabricate a p-type SiC single crystal using the prior art, such as PTL 1, it has not been possible to dope a sufficient amount of Al in the grown crystal, and it has been difficult to obtain a p-type SiC single crystal with low resistivity of a level necessary of practical use. A p-type SiC single crystal with lower resistivity than the prior art has therefore been desired.

Means for Solving the Problems

The present disclosure is a method for producing a SiC single crystal in which a SiC seed crystal substrate is contacted with a Si—C solution having a temperature gradient such that the temperature decreases from the interior toward the surface, to grow a SiC single crystal, the method comprising:
  using as the Si—C solution a Si—C solution containing Si, Cr and Al, wherein the Al content is 3 at % or greater based on the total of Si, Cr and Al; and
  contacting a (0001) face of the SiC seed crystal substrate with the Si—C solution to grow a SiC single crystal from the (0001) face.

Effect of the Invention

According to the present disclosure it is possible to obtain a p-type SiC single crystal having lower resistivity than the prior art.

DESCRIPTION OF EMBODIMENTS

Figure 1:
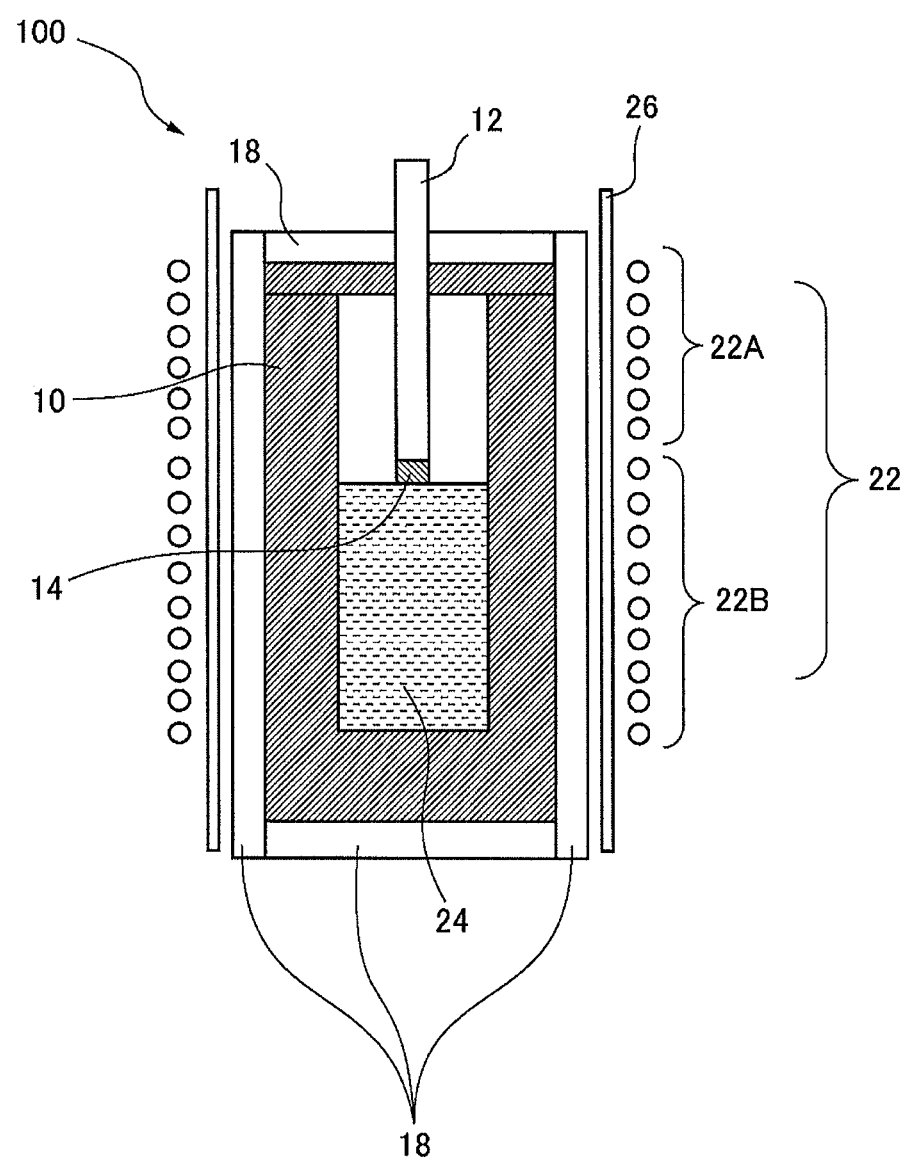
FIG. 1 is a cross-sectional schematic drawing showing an example of a single crystal production apparatus that can be used in a method for producing a p-type SiC single crystal of the present disclosure.

Throughout the present specification, the indication "-1" in an expression, such as "(000-1) face", is used where normally a transverse line is placed over the numeral.

The present inventors found that for growth of a SiC single crystal using a solution process, conducting Si (0001) face growth while keeping the Al amount in the Si—C solution at a prescribed amount or more allows a p-type SiC single crystal having much lower resistivity than the prior art to be obtained.

The present disclosure relates to a method for producing a SiC single crystal in which a SiC seed crystal substrate is contacted with a Si—C solution having a temperature gradient such that the temperature decreases from the interior toward the surface, to grow a SiC single crystal, the method comprising: using as the Si—C solution a Si—C solution containing Si, Cr and Al, wherein the Al content is 3 at % or greater based on the total of Si, Cr and Al; and contacting a (0001) face of the SiC seed crystal substrate with the Si—C solution to grow a SiC single crystal from the (0001) face.

According to the method of the present disclosure it is possible to obtain a p-type SiC single crystal having lower resistivity than the prior art.

A solution process is used in the method of the present disclosure. A solution process is a process for producing a SiC single crystal in which a SiC seed crystal substrate is contacted with a Si—C solution having a temperature gradient such that the temperature decreases from the interior toward the surface, to grow a SiC single crystal. By forming a temperature gradient in which the temperature decreases from the interior of the Si—C solution toward the surface of the solution, the surface region of the Si—C solution becomes supersaturated and a SiC single crystal is grown from the seed crystal substrate contacting with the Si—C solution.

Conventionally, when Al is doped in the attempt to obtain a p-type SiC single crystal with low resistivity, it has still not been possible to obtain a p-type SiC single crystal having low resistivity of the level necessary for practical use.

Surprisingly, however, it was found that if growth is conducted on the (0001) face (also known as the Si face) using a Si—C solution including Si, Cr and Al and including Al at 3 at % or greater based on the total amount of Si, Cr and Al, it is possible to obtain a p-type SiC single crystal having lower resistivity than the prior art and having resistivity of a level necessary for practical use. The p-type SiC single crystal obtained by the method of the present disclosure can have extremely low resistivity of about 1/100 of the resistivity of a conventional p-type SiC single crystal, or lower.

For SiC single crystal growth by a solution process, usually growth is conducted on the (000-1) face (also known as the C face), but (0001) face growth is conducted in the method of the present disclosure. While it is not our intention to be constrained by theory, it is believed that, due to the low number of Al-substituted sites on the (000-1) face, the upper limit for the Al doping amount in the SiC single crystal is about $1.8 \times 10^{20}/cm^3$ when growth is conducted on the (000-1) face, but since more Al-substituted sites are present on the (0001) face than on the (000-1) face, it is possible to increase the amount of Al uptake into the grown crystal, i.e. the amount of Al doping in the grown crystal. A higher concentration of Al doped in the p-type SiC single crystal generally results in lower resistivity of the p-type SiC single crystal.

It was also found, surprisingly, that if growth is conducted on the (0001) face using a Si—C solution including Si, Cr and Al and including Al at 3 at % or greater based on the total amount of Si, Cr and Al, it is possible to accomplish growth of a SiC single crystal without roughening of the growth surface. Conventionally, (0001) face growth has resulted in roughness of the growth surface and inability to accomplish satisfactory crystal growth, but by adding Al to the Si—C solution it is possible to accomplish satisfactory crystal growth even when (0001) face growth is conducted, and to obtain a high-quality SiC single crystal. Whether or not the growth surface of a SiC grown crystal is rough can be judged by observing the crystal surface after growth.

In the method of the present disclosure, the Si—C solution is a solution with C dissolved in a solvent which is a molten liquid containing Si, Cr and Al, wherein the Al content is 3 at % or greater based on the total amount of Si, Cr and Al.

The Al content of the Si—C solution is 3 at % or greater, preferably 5 at % or greater, more preferably 7 at % or greater, even more preferably 10 at % or greater and still more preferably 20 at % or greater, based on the total amount of Si, Cr and Al. If the amount of Al added to the Si—C solution is within the above range it will be possible to obtain a p-type SiC single crystal with lower resistivity than the prior art, by conducting (0001) face growth.

The upper limit for the Al content of the Si—C solution is preferably no greater than 50 at %, more preferably no greater than 40 at %, even more preferably no greater than 30 at % and yet more preferably no greater than 25 at %, based on the total amount of Si, Cr and Al. If the Al content of the Si—C solution is within the above range it will be possible to more stably grow a low resistivity p-type SiC single crystal.

The Cr content of the Si—C solution is preferably 20 to 60 at % based on the total amount of Si, Cr and Al.

The Si content of the Si—C solution is preferably 30 to 77 at % based on the total amount of Si, Cr and Al. If the Cr and Si contents of the Si—C solution are within the above range it will be possible to more stably grow a low resistivity p-type SiC single crystal.

The Si—C solution may contain other metals in addition to Si, Cr and Al. Such other metals are not particularly restricted so long as they can form a liquid phase (solution) in thermodynamic equilibrium with the SiC (solid phase), and they may include Ti, Mn, Ni, Ce, Co, V and Fe, for example.

More preferred is a Si—C solution wherein the solvent is a molten liquid with an atomic composition percentage of Si:Cr:Al=30-77:20-60:3-50, since it has low variation in C dissolution. That is, preferably the amounts of Si, Cr and Al in the Si—C solution are amounts such that Si/(Si+Cr+Al) is 30 to 77%, Cr/(Si+Cr+Al) is 20 to 60% and Al/(Si+Cr+Al) is 3 to 50%, in terms of atomic composition percentage.

The seed crystal substrate to be used in the method of the present disclosure may be a single crystal having quality commonly used for production of SiC single crystals. For example, a SiC single crystal commonly formed by a sublimation process may be used as the seed crystal substrate.

The seed crystal substrate may have any desired shape, such as plate-like, discoid, cylindrical, columnar, truncated circular conic or truncated pyramidal, so long as the growth surface is the (0001) face. The polytype of the seed crystal substrate may be 4H, 6H, 15R or 3C. 4H—SiC is preferred from the viewpoint of reducing the high hole mobility and low on-resistance when used as a power device.

The temperature gradient of a Si—C solution is the temperature gradient in the direction perpendicular to the surface of the Si—C solution (liquid surface) near the surface, which is a temperature gradient where the temperature falls from the interior of the Si—C solution toward the surface of the solution. The temperature gradient can be calculated as the average value obtained by pre-measuring the temperature A on the surface (liquid surface) of the Si—C solution which is the low-temperature side, and the temperature B which is the high-temperature side at a prescribed depth from the surface of the Si—C solution to the solution side in the direction perpendicular to the surface of the Si—C solution, by using a thermocouple before contacting the seed crystal substrate with the Si—C solution, and dividing the temperature difference by the distance between the positions at which temperature A and temperature B were measured. For example, when measuring the temperature gradient between the surface of the Si—C solution and the position at depth D cm from the surface of the Si—C solution to the solution side in the direction perpendicular to the surface of the Si—C solution, the temperature gradient can be calculated by the following formula:

$$\text{Temperature gradient}(°C./cm)=(B-A)/D \quad \text{formula}$$

wherein the temperature gradient is the difference between the surface temperature A of the Si—C solution and the temperature B at a position at depth D cm from the surface of the Si—C solution to the solution side in the direction perpendicular to the surface of the Si—C solution, divided by D cm.

The range in which the temperature gradient is controlled is preferably to a depth of 1 cm and more preferably 3 cm from the surface of the Si—C solution. When the temperature gradient is to be controlled in a range to a depth of 3 cm from the surface of the Si—C solution, the temperature gradient (° C./cm) in the formula is the value obtained when the difference between the surface temperature A of the Si—C solution and the temperature B at a position at a depth of 3 cm from the surface of the Si—C solution to the solution side in the direction perpendicular to the surface of the Si—C solution, is divided by 3 cm.

When the range of control of the temperature gradient is too shallow, the range in which the degree of supersaturation of C is controlled will also be shallow, sometimes causing growth of the SiC single crystal to be unstable. If the range of control of the temperature gradient is too deep, the range in which the degree of supersaturation of C is controlled will also be deep, which is effective for stable growth of the SiC single crystal, but in actuality the depth contributing to single crystal growth is very close to the surface of the Si—C solution and therefore it is sufficient to control the temperature gradient up to a depth of several mm from the surface. Consequently, in order to conduct stable SiC single crystal growth and temperature gradient control, it is preferred to control the temperature gradient within the depth range specified above.

According to the method of the present disclosure, it is possible to obtain a p-type SiC single crystal having an Al concentration of $2.0 \times 10^{20}/cm^3$ or greater, preferably $3.0 \times 10^{20}/cm^3$ or greater, more preferably $4.0 \times 10^{20}/cm^3$ or greater, even more preferably $5.0 \times 10^{20}/cm^3$ or greater and yet more preferably $6.0 \times 10^{20}/cm^3$ m or greater. The upper limit for the Al concentration in the p-type SiC single crystal is about $6.0 \times 10^{20}/cm^3$. By doping a p-type SiC single crystal with an Al concentration in the above range, it is possible to obtain a p-type SiC single crystal having low resistivity.

The Al concentration in the SiC single crystal can be measured by using secondary ion mass spectrometry (SIMS).

The method of the present disclosure can yield a p-type SiC single crystal having resistivity of no greater than 30 mΩ·cm, preferably no greater than 20 mΩ·cm and more preferably no greater than 10 mΩ·cm. The resistivity of a p-type SiC single crystal tends to be lower with a greater Al concentration, but the lower limit for the resistivity of a p-type SiC single crystal is determined by the upper limit of the Al solid solution concentration in the SiC grown crystal, and it is approximately 10 mΩ·cm or greater.

The resistivity of the obtained grown crystal can be measured by Hall measurement using the Van der Pauw method.

According to the method of the present disclosure, it is possible to obtain a p-type SiC single crystal having a thickness of preferably 100 μm or greater, more preferably 200 μm or greater, even more preferably 300 μm or greater, yet more preferably 400 μm or greater and even yet more preferably 500 μm or greater.

Placement of the seed crystal substrate in the single crystal production apparatus may be done by holding the top face of the seed crystal substrate on the seed crystal holding shaft as described above. A carbon adhesive may be used for holding the seed crystal substrate on the seed crystal holding shaft.

Contact of the seed crystal substrate with the Si—C solution may be carried out by lowering the seed crystal holding shaft holding the seed crystal substrate toward the Si—C solution surface, and contacting it with the Si—C solution while the (0001) face, which is the bottom face of the seed crystal substrate, is parallel to the Si—C solution surface. The seed crystal substrate may be held at a prescribed position relative to the Si—C solution surface for growth of the SiC single crystal.

Figure 2:
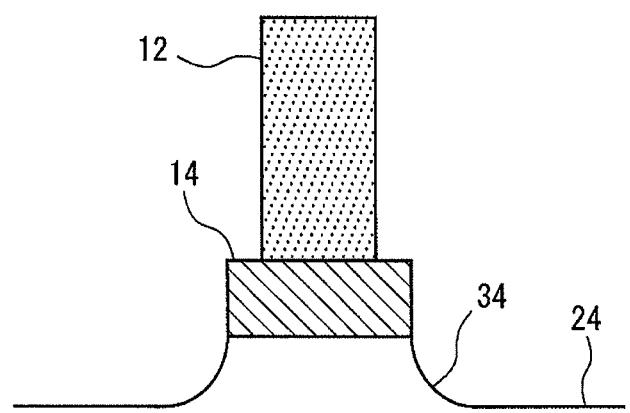
FIG. 2 is a cross-sectional schematic drawing of a meniscus formed between a seed crystal substrate and a Si—C solution.

The holding position of the seed crystal substrate may be such that the position of the bottom face of the seed crystal substrate matches the Si—C solution surface, is below the Si—C solution surface, or is above the Si—C solution surface. As shown in FIG. 2, the position of the bottom face of the seed crystal substrate is preferably above the Si—C solution surface, so that the Si—C solution 24 wets only the bottom face of the seed crystal substrate 14, forming a meniscus 34. When a meniscus is formed, the position of the bottom face of the seed crystal substrate is preferably held at a position 1 to 3 mm above the Si—C solution surface. When it is held so that the bottom face of the seed crystal substrate is at a position above the Si—C solution surface, the seed crystal substrate is contacted once with the Si—C solution so that the Si—C solution contacts with the bottom face of the seed crystal substrate, and it is then raised to the prescribed position. Thus, by forming a meniscus and conducting crystal growth, it is possible to avoid contact of the Si—C solution with the seed crystal holding shaft, to more easily prevent generation of polycrystals.

The position of the bottom face of the seed crystal substrate may match the Si—C solution surface or be lower than the Si—C solution surface, but in order to prevent generation of polycrystals, it is preferably such that the Si—C solution does not contact with the seed crystal holding shaft. In such methods, the position of the seed crystal substrate may be adjusted during growth of the single crystal.

In the method of the present disclosure, the lower limit for the surface temperature of the Si—C solution is preferably 1800° C. or higher and the upper limit is preferably 2200° C., since the dissolution of C in the Si—C solution can be increased within this temperature range.

Temperature measurement of the Si—C solution can be carried out by using a thermocouple or radiation thermometer. From the viewpoint of high temperature measurement and preventing inclusion of impurities, the thermocouple is preferably a thermocouple comprising a tungsten-rhenium wire covered with zirconia or magnesia glass, placed inside a graphite protection tube.

FIG. 1 shows an example of a SiC single crystal production apparatus for carrying out the invention. The illustrated SiC single crystal production apparatus 100 comprises a crucible 10, wherein the crucible 10 receives a Si—C solution 24 having C dissolved in a molten liquid containing Si, Cr and Al, a temperature gradient is formed in which the temperature is decreased from the interior of the Si—C solution toward the surface of the solution, and the seed crystal substrate 14 that is held at the tip of the vertically movable seed crystal holding shaft 12 is contacted with the Si—C solution 24 to allow growth of the SiC single crystal from the seed crystal substrate 14.

The Si—C solution 24 is prepared by loading the starting materials into the crucible, melting them by heating to prepare molten liquid containing Si, Cr and Al, and dissolving C therein. If the crucible 10 is a carbonaceous crucible, such as a graphite crucible, or SiC crucible, C will dissolve into the molten liquid by dissolution of the crucible 10, thereby allowing a Si—C solution to be formed. This will avoid the presence of undissolved C in the Si—C solution 24, and prevent waste of SiC due to deposition of the SiC single crystal onto the undissolved C. The supply of C may be carried out by utilizing a method of, for example, blowing in hydrocarbon gas or loading a solid C source together with the other molten liquid starting material, or these methods may be combined together with dissolution of the crucible.

For thermal insulation, the outer periphery of the crucible 10 is covered with a heat-insulating material 18. These are housed together inside a quartz tube 26. A high-frequency coil 22 for heating is disposed around the outer periphery of the quartz tube 26. The high-frequency coil 22 may be configured with an upper level coil 22A and a lower level coil 22B. The upper level coil 22A and lower level coil 22B can be independently regulated.

Since the temperatures of the crucible 10, heat-insulating material 18, quartz tube 26 and high-frequency coil 22 become high, they are situated inside a water-cooling chamber. The water-cooling chamber is provided with a gas inlet and a gas exhaust vent to allow atmospheric modification in the apparatus.

The temperature of the Si—C solution usually has a temperature distribution with a lower temperature at the surface of the Si—C solution than the interior thereof due to radiation and the like. Further, a temperature gradient can be formed in the Si—C solution 24 in the direction perpendicular to the surface of the Si—C solution 24 so that an upper portion of the solution contacting the seed crystal substrate 14 is at low temperature and a lower portion of the solution (the interior) is at high temperature, by adjusting the number of coils and spacing of the high-frequency coil 22, the positional relationship of the high-frequency coil 22 and the crucible 10 in the height direction, and the output of the high-frequency coil. For example, the output of the upper level coil 22A may be smaller than the output of the lower level coil 22B, to form a temperature gradient in the Si—C solution 24 in which an upper portion of the solution is at low temperature and a lower portion of the solution is at high temperature.

The C that has dissolved in the Si—C solution 24 is dispersed by diffusion and convection. In the vicinity of the bottom surface of the seed crystal substrate 14, a temperature gradient is formed, in which the temperature is lower compared to a lower portion of the Si—C solution 24, by utilizing the power control of the heating apparatus, heat radiation from the surface of the Si—C solution 24, and heat loss through the seed crystal holding shaft 12. When the C that has dissolved into the solution interior that is at high temperature and has high solubility reaches the region near the seed crystal substrate that is at low temperature and has low solubility, a supersaturation state appears and a SiC single crystal is grown on the seed crystal substrate by virtue of supersaturation as a driving force.

According to one embodiment, meltback may be carried out in which the surface layer of the seed crystal substrate is dissolved in the Si—C solution and removed prior to growth of a SiC single crystal. Since the surface layer of the seed crystal substrate on which the SiC single crystal is grown may have an affected layer, such as a dislocation, a natural oxide film, or the like, removal of the same by dissolution prior to growth of a SiC single crystal is effective for growing a high-quality SiC single crystal. Although the thickness of a layer to be removed depends on processed conditions of the surface of a SiC seed crystal substrate, it is preferably approximately 5 to 50 µm for sufficient removal of an affected layer and a natural oxide layer.

The meltback may be carried out by forming a temperature gradient in which the temperature increases from the interior of the Si—C solution toward the surface of the solution, i.e., by forming, in the Si—C solution, a temperature gradient in a direction opposite to the case of SiC single crystal growth. The temperature gradient in the opposite direction can be formed by regulating the output of the high-frequency coil.

According to one embodiment, the seed crystal substrate may be preheated in advance, and then the same is contacted with the Si—C solution. If the seed crystal substrate at a low temperature is contacted with the Si—C solution at high temperature, heat shock dislocations may be generated in the seed crystal. Preheating of the seed crystal substrate before contacting the seed crystal substrate with the Si—C solution prevents heat shock dislocation and is effective for growth of a high-quality SiC single crystal. The seed crystal substrate may be heated together with the seed crystal holding shaft. In this case, heating of the seed crystal holding shaft is stopped after contact of the seed crystal substrate with the Si—C solution and before growth of the SiC single crystal. Alternatively, the Si—C solution may be heated to the temperature for crystal growth after contacting the seed crystal substrate with the Si—C solution at a relatively low temperature. This is also effective for preventing heat shock dislocations and growing a high-quality SiC single crystal.

The present disclosure further relates to a p-type SiC single crystal having an Al concentration of $2.0 \times 10^{20}/cm^3$ or greater. The Al concentration of the p-type SiC single crystal is preferably $3.0 \times 10^{20}/cm^3$ or greater, more preferably $4.0 \times 10^{20}/cm^3$ or greater, even more preferably $5.0 \times 10^{20}/cm^3$ or greater and yet more preferably $6.0 \times 10^{20}/cm^3$ or greater. The upper limit for the Al concentration in the p-type SiC single crystal is about $6.0 \times 10^{20}/cm^3$.

If the Si—C solution contains an Al concentration within the above range it will be possible to obtain a p-type SiC single crystal having low resistivity.

The present disclosure also relates to a p-type SiC single crystal having a resistivity of no greater than 30 mΩ·cm. The resistivity of the p-type SiC single crystal is preferably no greater than 20 mΩ·cm and even more preferably no greater than 10 mΩ·cm. The resistivity of the p-type SiC single crystal tends to be lower with a greater Al concentration, but the lower limit for the resistivity of the p-type SiC single crystal is determined by the upper limit of the Al solid solution concentration in the SiC grown crystal, and it is approximately 10 mΩ·cm or greater.

The p-type SiC single crystal of the present disclosure has a thickness of preferably 100 µm or greater, more preferably 200 µm or greater, even more preferably 300 µm or greater, yet more preferably 400 µm or greater and even yet more preferably 500 µm or greater.

The p-type SiC single crystal of the present disclosure can have an Al concentration, resistivity and/or thickness in the ranges specified above.

The p-type SiC single crystal of the present disclosure can be obtained by the method for producing a SiC single crystal described above. Specifically, the p-type SiC single crystal of the present disclosure is a SiC single crystal grown from a seed crystal substrate by a solution process, and after the SiC single crystal has been grown from the seed crystal substrate, the grown crystal can be obtained by cutting out from the Si—C solution and seed crystal substrate.

The method for measuring the Al concentration in the SiC grown crystal, etc., as described for the method of the present disclosure, is applied in the same manner for the p-type SiC single crystal of the disclosure.

EXAMPLES

Example 1

There was prepared a n-type SiC single crystal formed by a sublimation process, which was a discoid 4H—SiC single crystal with a diameter of 15 mm, a thickness of 700 μm, and the bottom face as the (0001) face, for use as a seed crystal substrate. The seed crystal substrate had a resistivity of 20 mΩ·cm. The top face of the seed crystal substrate was bonded to roughly the center section of the end face of a cylindrical graphite shaft, using a graphite adhesive.

A single crystal production apparatus as shown in FIG. 1 was used, and Si, Cr and Al were loaded as a molten liquid material for formation of a Si—C solution, at an atomic composition percentage of Si:Cr:Al=58.2:38.8:3 (at %), into a graphite crucible holding a Si—C solution. That is, the solvent composition of the Si—C solution was Si:Cr:Al=58.2:38.8:3 (at %).

After vacuum suction of the interior of the single crystal production apparatus to $1 \times 10^{-3}$ Pa, argon gas was introduced to 1 atmosphere and the air inside the single crystal production apparatus was exchanged with argon. A high-frequency coil was electrified to melt the starting material in the graphite crucible by heating, thereby forming a Si/Cr/Al alloy molten liquid. Then, a sufficient amount of C was dissolved into the Si/Cr/Al alloy molten liquid from the graphite crucible to form a Si—C solution.

The outputs of the upper level coil and lower level coil were adjusted to heat the graphite crucible so that the temperature of the surface of the Si—C solution was increased to 2000° C., and a temperature gradient in which the temperature decreased from the solution interior in a range of 1 cm from the Si—C solution surface toward the solution surface, was 30° C./cm. Temperature measurement of the surface of the Si—C solution was conducted with a radiation thermometer, and measurement of the temperature gradient of the Si—C solution was conducted by using a vertically movable thermocouple.

Seed touching was conducted, in which the position of the bottom face of the seed crystal substrate was placed at a position matching the liquid surface of the Si—C solution, and the bottom face of the seed crystal substrate was contacted with the Si—C solution, while keeping the (0001) face, which was the bottom face of the seed crystal substrate bonded to the graphite shaft, parallel to the Si—C solution surface. The graphite shaft was then raised 1.5 mm to form a meniscus so that the Si—C solution was prevented from seeping upward and contacting the graphite shaft, and it was held at that position for 1 hour for (0001) face growth.

Figure 4:
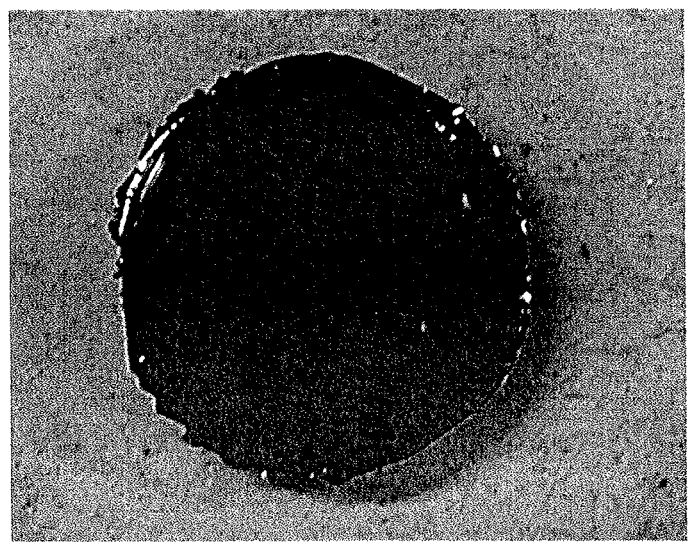
FIG. 4 is an external photograph of the growth surface of an obtained grown crystal.

Upon completion of the crystal growth, the graphite shaft was raised, and the seed crystal substrate and the SiC single crystal grown from the seed crystal substrate were severed from the Si—C solution and the graphite shaft and were recovered. The obtained grown crystal had a diameter of 20 mm and a thickness of 0.3 mm, and no roughness was seen on the growth surface. The diameter of the obtained grown crystal is the diameter of the growth surface. FIG. 4 shows an external photograph of the growth surface of the obtained grown crystal.

The Al concentration in the grown crystal was measured by secondary ion mass spectrometry (SIMS, product of Cameca). The reference sample used was a sample comprising Al ion-implanted into a SiC substrate. The Al concentration of the grown crystal was $2.0 \times 10^{20}/cm^3$.

In order to measure the resistivity of the obtained grown crystal, the (0001) face of the grown crystal cut out to a thickness of 0.5 mm from the growth surface was mirror polished, worked to a 5 mm square and cleaned. Then, a circular Ni ohmic electrode with a diameter of 1 mm was then formed by vacuum vapor deposition on the four corners of the (0001) face. The electrode-attached grown crystal was used for Hall measurement by the Van der Pauw method at room temperature (25° C.), and measurement of the resistivity of the grown crystal revealed a resistivity of 30 mΩ·cm, indicating that a p-type SiC single crystal with low resistivity had been obtained.

Example 2

Crystal growth was conducted under the same conditions as Example 1, except that the solvent composition (Si:Cr:Al) of the Si—C solution was 54:36:10 (at %).

The obtained grown crystal was a p-type SiC single crystal having a diameter of 20 mm, a thickness of 0.3 mm, an Al concentration of $6.0 \times 10^{20}/cm^3$ and a resistivity of 10 mΩ·cm, and no roughness was seen on the growth surface.

Example 3

Crystal growth was conducted under the same conditions as Example 1, except that the solvent composition (Si:Cr:Al) of the Si—C solution was 48:32:20 (at %).

The obtained grown crystal was a p-type SiC single crystal having a diameter of 20 mm, a thickness of 0.3 mm, an Al concentration of $6.0 \times 10^{20}/cm^3$ and a resistivity of 10 mΩ·cm, and no roughness was seen on the growth surface.

Comparative Example 1

Crystal growth was conducted under the same conditions as Example 1, except that a n-type SiC single crystal formed by a sublimation process, which was a discoid 4H—SiC single crystal having a diameter of 15 mm, a thickness of 700 μm, and the (000-1) face as the bottom face, was prepared, the solvent composition (Si:Cr:Al) of the Si—C solution was 54:36:10 (at %), and (000-1) face growth was conducted.

The obtained grown crystal was a p-type SiC single crystal having a diameter of 20 mm, a thickness of 0.3 mm, an Al concentration of $1.8 \times 10^{20}/cm^3$ and a resistivity of 35 mΩ·cm.

Comparative Example 2

Crystal growth was carried out under the same conditions as Comparative Example 1, except that the solvent composition (Si:Cr:Al) of the Si—C solution was 59.4:39.6:1 (at %).

The obtained grown crystal was a p-type SiC single crystal having a diameter of 20 mm, a thickness of 0.3 mm, an Al concentration of $3.5 \times 10^{19}/cm^3$ and a resistivity of 1219 mΩ·cm.

Comparative Example 3

Crystal growth was carried out under the same conditions as Comparative Example 1, except that the solvent composition (Si:Cr:Al) of the Si—C solution was 58.2:38.8:3 (at %).

The obtained grown crystal was a p-type SiC single crystal having a diameter of 20 mm, a thickness of 0.3 mm, an Al concentration of $6.3 \times 10^{19}/cm^3$ and a resistivity of 120 mΩ·cm.

Comparative Example 4

Crystal growth was carried out under the same conditions as Comparative Example 1, except that the solvent composition (Si:Cr:Al) of the Si—C solution was 48:32:20 (at %).

The obtained grown crystal was a p-type SiC single crystal having a diameter of 20 mm, a thickness of 0.3 mm, an Al concentration of $1.8 \times 10^{20}/cm^3$ and a resistivity of 35 mΩ·cm.

Comparative Example 5

Crystal growth was conducted under the same conditions as Example 1, except that the solvent composition (Si:Cr:Al) of the Si—C solution was 59.4:39.6:1 (at %).

The obtained grown crystal was a p-type SiC single crystal having a diameter of 20 mm, a thickness of 0.3 mm, an Al concentration of $6.0 \times 10^{19}/cm^3$ and a resistivity of 130 mΩ·cm.

Figure 3:
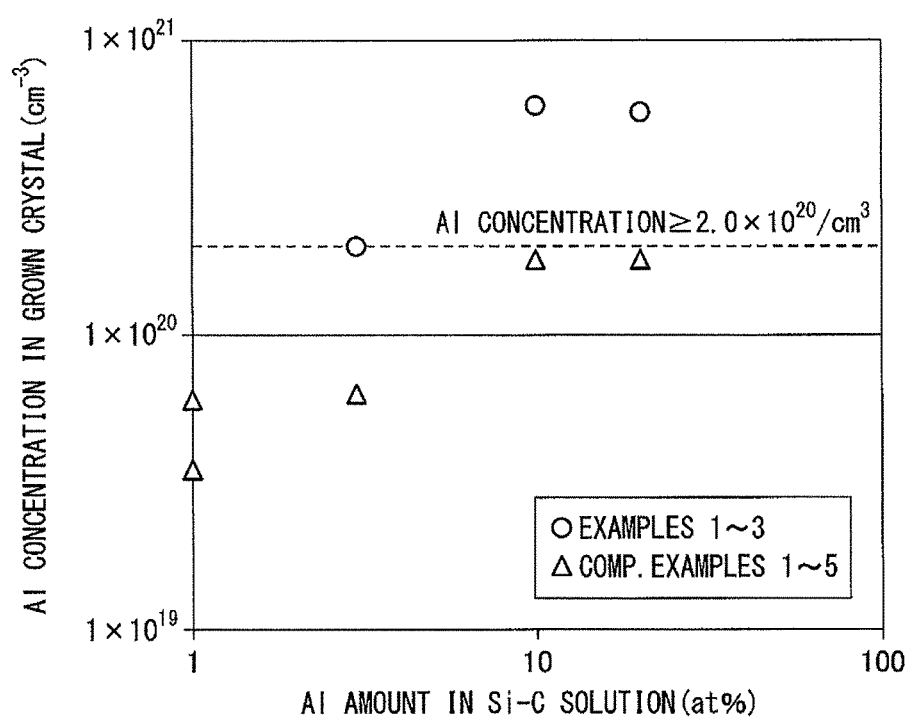
FIG. 3 is a graph showing the relationship between Al amount in the Si—C solution and Al concentration in the grown crystal.

Table 1 shows the Al concentrations and resistivities of the SiC single crystals obtained in Examples 1 to 3 and Comparative Examples 1 to 5. FIG. 3 is a graph showing the relationship between Al amount in the Si—C solution and Al concentration in the grown crystal.

TABLE 1

|  | Grown crystal surface | Al amount (at %) | Al concentration ($cm^{-3}$) | Resistivity (mΩ · cm) |
|---|---|---|---|---|
| Example 1 | (0001) | 3 | $2.0 \times 10^{20}$ | 30 |
| Example 2 | (0001) | 10 | $6.0 \times 10^{20}$ | 10 |
| Example 3 | (0001) | 20 | $6.0 \times 10^{20}$ | 10 |
| Comp. Ex. 1 | (000-1) | 10 | $1.8 \times 10^{20}$ | 35 |
| Comp. Ex. 2 | (000-1) | 1 | $3.5 \times 10^{19}$ | 1219 |
| Comp. Ex. 3 | (000-1) | 3 | $6.3 \times 10^{19}$ | 120 |
| Comp. Ex. 4 | (000-1) | 20 | $1.8 \times 10^{20}$ | 35 |
| Comp. Ex. 5 | (0001) | 1 | $6.0 \times 10^{19}$ | 130 |

EXPLANATION OF SYMBOLS

100 Single crystal production apparatus
10 Crucible
12 Seed crystal holding shaft
14 Seed crystal substrate
18 Heat-insulating material
22 High-frequency coil
22A Upper level high-frequency coil
22B Lower level high-frequency coil
24 Si—C solution
26 Quartz tube
34 Meniscus

What is claimed is:

1. A method for producing a p-type SiC single crystal in which a SiC seed crystal substrate is contacted with a Si—C solution having a temperature gradient such that the temperature decreases from the interior toward the surface, to grow a p-type SiC single crystal, the method comprising:
    using as the Si—C solution a Si—C solution containing Si, Cr and Al, wherein the Al content is 7 at % or greater based on the total of Si, Cr and Al; and
    contacting a (0001) face of the SiC seed crystal substrate with the Si—C solution to grow a p-type SiC single crystal from the (0001) face while forming a meniscus such that the position of the (0001) face of the SiC seed crystal substrate is held at a position 1 to 3 mm above the Si—C solution surface,
    wherein the p-type SiC single crystal has an Al concentration of $2.0 \times 10^{20}$ to $6.0 \times 10^{20}/cm^3$ and a resistivity of 10 to 30 mΩ·cm.

* * * * *